(12) United States Patent
Schollenberger

(10) Patent No.: US 6,889,282 B2
(45) Date of Patent: May 3, 2005

(54) FIELDBUS CONNECTING SYSTEM FOR ACTUATORS OR SENSORS

(75) Inventor: Lothar Schollenberger, Hirschberg (DE)

(73) Assignee: ABB Patent GmbH, Ladenburg (DE)

( * ) Notice: Subject to any disclaimer, the term of this patent is extended or adjusted under 35 U.S.C. 154(b) by 472 days.

(21) Appl. No.: 09/891,186

(22) Filed: Jun. 25, 2001

(65) Prior Publication Data

US 2001/0056516 A1 Dec. 27, 2001

(30) Foreign Application Priority Data

Jun. 23, 2000 (DE) .......................... 100 30 845

(51) Int. Cl.⁷ ............................................ G06F 13/14
(52) U.S. Cl. .................... 710/305; 710/11; 710/105; 710/104; 710/8; 713/1; 713/100; 700/1; 702/1
(58) Field of Search ........................ 710/11, 105, 104, 710/8, 305; 713/1, 100; 700/1; 702/1

(56) References Cited

U.S. PATENT DOCUMENTS

| | | | | | |
|---|---|---|---|---|---|
| 5,764,891 | A | * | 6/1998 | Warrior ........................ | 710/72 |
| 5,841,654 | A | * | 11/1998 | Verissimo et al. ............ | 700/83 |
| 5,923,557 | A | * | 7/1999 | Eidson ........................ | 700/129 |
| 6,032,203 | A | * | 2/2000 | Heidhues ..................... | 710/11 |
| 6,098,116 | A | * | 8/2000 | Nixon et al. ................... | 710/8 |
| 6,128,689 | A | * | 10/2000 | Hassbjer et al. ............. | 710/305 |
| 6,151,640 | A | * | 11/2000 | Buda et al. .................... | 710/11 |
| 6,192,281 | B1 | * | 2/2001 | Brown et al. ................... | 700/2 |
| 6,266,726 | B1 | * | 7/2001 | Nixon et al. ................. | 710/105 |
| 6,304,934 | B1 | * | 10/2001 | Pimenta et al. .............. | 710/305 |

FOREIGN PATENT DOCUMENTS

| DE | 43 02 032 A1 | 8/1994 | | |
|---|---|---|---|---|
| DE | 43 44 904 A1 | 8/1995 | | |
| DE | 196 46 219 A1 | 12/1997 | | |
| DE | 298 10 482 U1 | * 10/1999 | ........... | G06F/13/38 |
| EP | 0 680 421 B1 | 11/1995 | | |
| EP | 895145 A1 | * 2/1999 | ........... | G05B/19/05 |
| EP | 0 906 595 B1 | 4/1999 | | |
| WO | WO 9937435 A1 | * 7/1999 | ........... | B23K/11/25 |

OTHER PUBLICATIONS

Lee, Kang, "IEEE 1451: A Standard in Support of Smart Transducer Networking," May 4, 2000, IEEE, Instrumentation and Measurement Technology Conference, 2000, vol. 2, p. 525–528.*

Santori, M., et al., "Fieldbus Brings Protocol to Process Control," Mar. 1996, IEEE, Spectrum, vol. 33, Issue 3, p. 60–64.*

Wilson, P.D., et al., "Applications of a Universal Sensor Interface Chip (USIC) for Intelligent Sensor Applications," Dec. 7, 1995 IEEE Colloquium on Advances in Sensors, p. 3/1–3/6.*

* cited by examiner

*Primary Examiner*—Mark H. Rinehart
*Assistant Examiner*—Donna K. Mason
(74) *Attorney, Agent, or Firm*—Laurence A. Greenberg; Werner H. Stemer; Gregory L. Mayback

(57) ABSTRACT

A modular connecting system for connecting an external device to a fieldbus system includes a fieldbus-specific fieldbus interface circuit and a fieldbus-independent interface device connected to the interface circuit. The interface device has operating modes and is to be selectively connected to an external device including not only simple sensors or actuators with parallel signal transmission, but also complex sensors or actuators with series signal transmission. The interface device connects the external device to said interface circuit during parallel signal transmission and serial signal transmission. The interface device is programmed to autonomously check a type of the external device connected to said interface device and to select an appropriate subset of said operating modes for the type of the external device.

11 Claims, 2 Drawing Sheets

FIELDBUS CONNECTING SYSTEM FOR ACTUATORS OR SENSORS

BACKGROUND OF THE INVENTION

Field of the Invention

The invention relates to a connecting system for connecting sensors or actuators to a fieldbus.

In automation systems, fieldbuses are used for connecting sensors or actuators to input/output apparatuses of control and regulation devices. A large number of different fieldbuses are commercially available and, as a consequence, there are a correspondingly large number of fieldbus-specific fieldbus interface circuits to which actuators or sensors can be connected.

Sensors are used in automation systems for detecting process variables. A wide range of sensor types are used that, in the simplest case, supply only a binary signal, but that can also supply a number of digital or analogue signals. The wide range of actuators is similar, and these may be simple switching devices or else, for example, frequency converters with control functions.

Users of sensors or actuators desire to be able to use such products universally, that is to say, to allow them to be connected to any desired fieldbus, or for them at least to be available in a different configuration for connection to different fieldbuses. For universal applicability, a configuration having a number of fieldbus interface circuits would be required in sensors or actuators. Such a configuration is impossible for cost and space reasons. The provision of sensors or actuators with different fieldbus connections would involve considerable effort for the supplier.

SUMMARY OF THE INVENTION

It is accordingly an object of the invention to provide a fieldbus connecting system for actuators or sensors that overcomes the hereinafore-mentioned disadvantages of the heretofore-known devices of this general type and that specifies a system for connecting sensors or actuators of different complexity to different fieldbus systems that can be produced with relatively little additional effort.

With the foregoing and other objects in view, there is provided, in accordance with the invention, a modular connecting system for connecting an external device to a fieldbus system, including a fieldbus-specific fieldbus interface circuit and a fieldbus-independent interface device connected to the interface circuit. The interface device has operating modes and is to be selectively connected to an external device including sensor and/or actuators having varying degrees of complexity. The interface device connects the external device to the interface circuit during parallel signal transmission and serial signal transmission. The interface device is programmed to autonomously check a type of the external device connected to the interface device and to select an appropriate subset of the operating modes for the type of the external device.

In the connecting system for connection of sensors or actuators to a fieldbus interface circuit of a respective fieldbus system according to the invention, the fieldbus interface circuit has an upstream interface device, to which simple or complex sensors or actuators can optionally be connected. The interface device is set up to check autonomously what type of sensor or actuator is connected, and to select an appropriate operating mode for it. The check is carried out by a test message that the interface device sends to the connected actuator or sensor.

As a linking element, the interface device thus allows both simple and complex standardized sensors or actuators to be connected to different, likewise standardized, bus interface circuits.

In accordance with another feature of the invention, the operating modes include a first operating mode and a second operating mode, and the interface device has an electronic circuit programmed to set up the interface device by selecting one of the first and second operating modes.

In accordance with a further feature of the invention, the electronic circuit is a microcontroller.

In accordance with an added feature of the invention, the operating modes include a first operating mode for parallel signal input, and a second operating mode for serial signal input, the interface device receives an operating voltage, and the interface device is programmed to operate in the second operating mode when the operating voltage is switched on, to send a serial test message to the external device connected to the interface device and to wait for a response from the external device, and to switch to the first operating mode if the response is not received by the interface device.

In accordance with an additional feature of the invention, there is provided a fieldbus plug-in apparatus and the interface device is integrated in the fieldbus plug-in apparatus.

In accordance with yet another feature of the invention, the interface device is programmed to output a serial output signal in all of the operating modes.

In accordance with yet a further feature of the invention, the interface device directly connects to the external device by a standard plug-in apparatus having a standardized connector wiring.

In accordance with yet an added feature of the invention, there is provided a standard plug-in apparatus having a standardized connector wiring, and the interface device directly connects to the external device by the standard plug-in apparatus.

With the objects of the invention in view, there is also provided a modular connecting system for connecting an external device to at least one fieldbus cable of a fieldbus system, the connecting system including a fieldbus plug to be removably connected to the a fieldbus cable. The fieldbus plug has a fieldbus-specific fieldbus interface circuit to be connected to a fieldbus cable, and a fieldbus-independent interface device connected to the interface circuit. The interface device has operating modes and is to be selectively connected to an external device. The interface device connects the external device to the interface circuit during parallel signal transmission and serial signal transmission.

The interface device is programmed to autonomously check a type of the external device connected to the interface device and to select an appropriate subset of the operating modes for the type of the external device.

With the objects of the invention in view, in a fieldbus system having at least one fieldbus-specific fieldbus interface circuit, there is also provided a modular connecting system for connecting an external device to the fieldbus system, the connecting system including a fieldbus-independent interface device connected to the interface circuit. The interface device has operating modes and is to be selectively connected to the external device. The interface device connects the external device to the interface circuit during parallel signal transmission and serial signal transmission. The interface device is programmed to autonomously check a type of the external device connected to the interface device and to select an appropriate subset of the operating modes for the type of the external device.

With the objects of the invention in view, there is also provided a modular connecting system for a fieldbus system, including a fieldbus-specific fieldbus interface circuit, a fieldbus-independent interface device connected to the interface circuit, and sensors and actuators having types and varying degrees of complexity. The interface device has operating modes and is selectively connected to a sensor or actuator. The interface device connects the sensor or actuator to the interface circuit during parallel signal transmission and serial signal transmission. The interface device is programmed to autonomously check a type of the one of the sensors and the actuators connected to the interface device and to select an appropriate subset of the operating modes for the type of the sensors and the actuators.

Other features that are considered as characteristic for the invention are set forth in the appended claims.

Although the invention is illustrated and described herein as embodied in a fieldbus connecting system for actuators or sensors, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
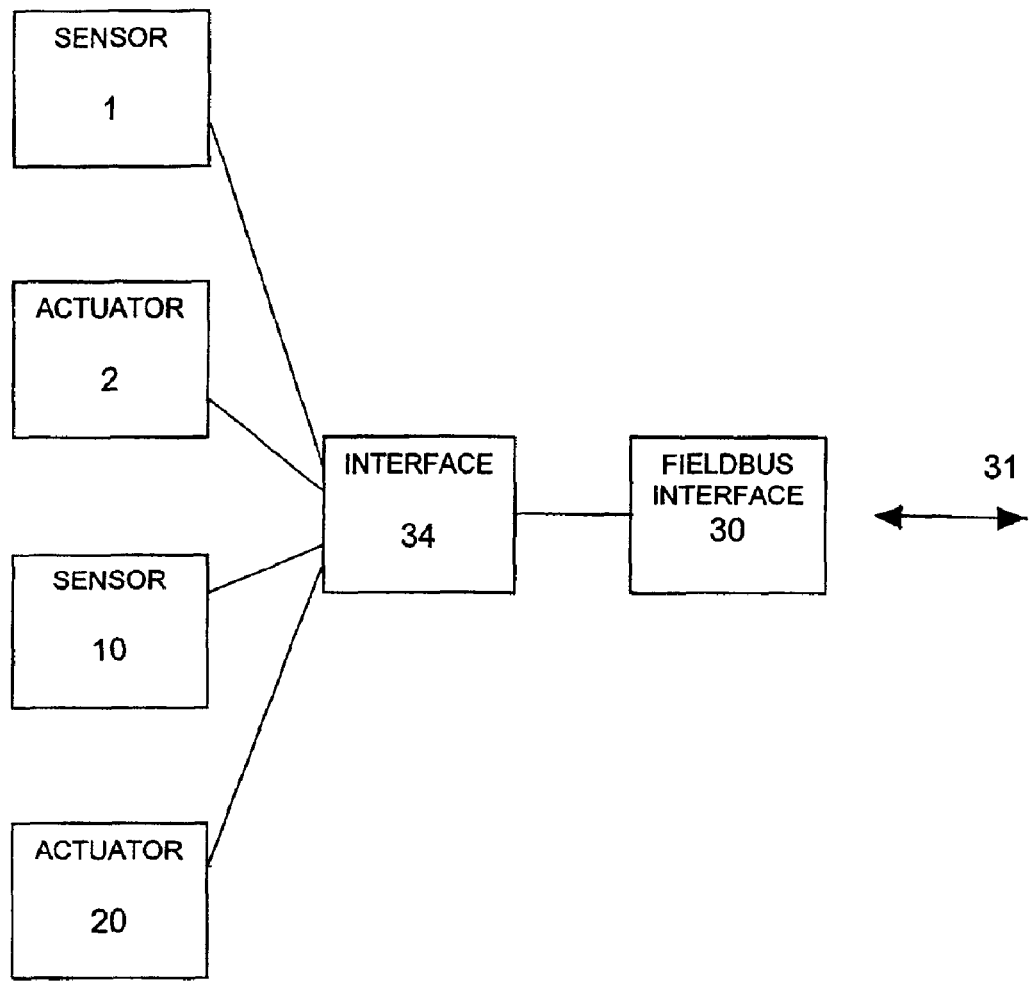
FIG. 1 is a block circuit diagram of an interface configuration according to the invention.

In all the figures of the drawing, sub-features and integral parts that correspond to one another bear the same reference symbol in each case.

Referring now to the figures of the drawings in detail and first, particularly to FIG. 1 thereof, there is shown a block circuit diagram of an interface device 34 in which a defined neutral interface, that is to say, an interface that is independent of the respective fieldbus system, is implemented using an electronic circuit, for example, a microprocessor or microcontroller. The interface device 34 is upstream of a fieldbus-specific fieldbus interface circuit 30, to which lines of a fieldbus 31 can be connected. Both simple sensors 1 or actuators 2 as well as complex sensors 10 or actuators 20 can optionally be connected to the interface device 34. The method of operation of such a configuration will be explained in the following text, with reference to FIG. 2.

Figure 2:
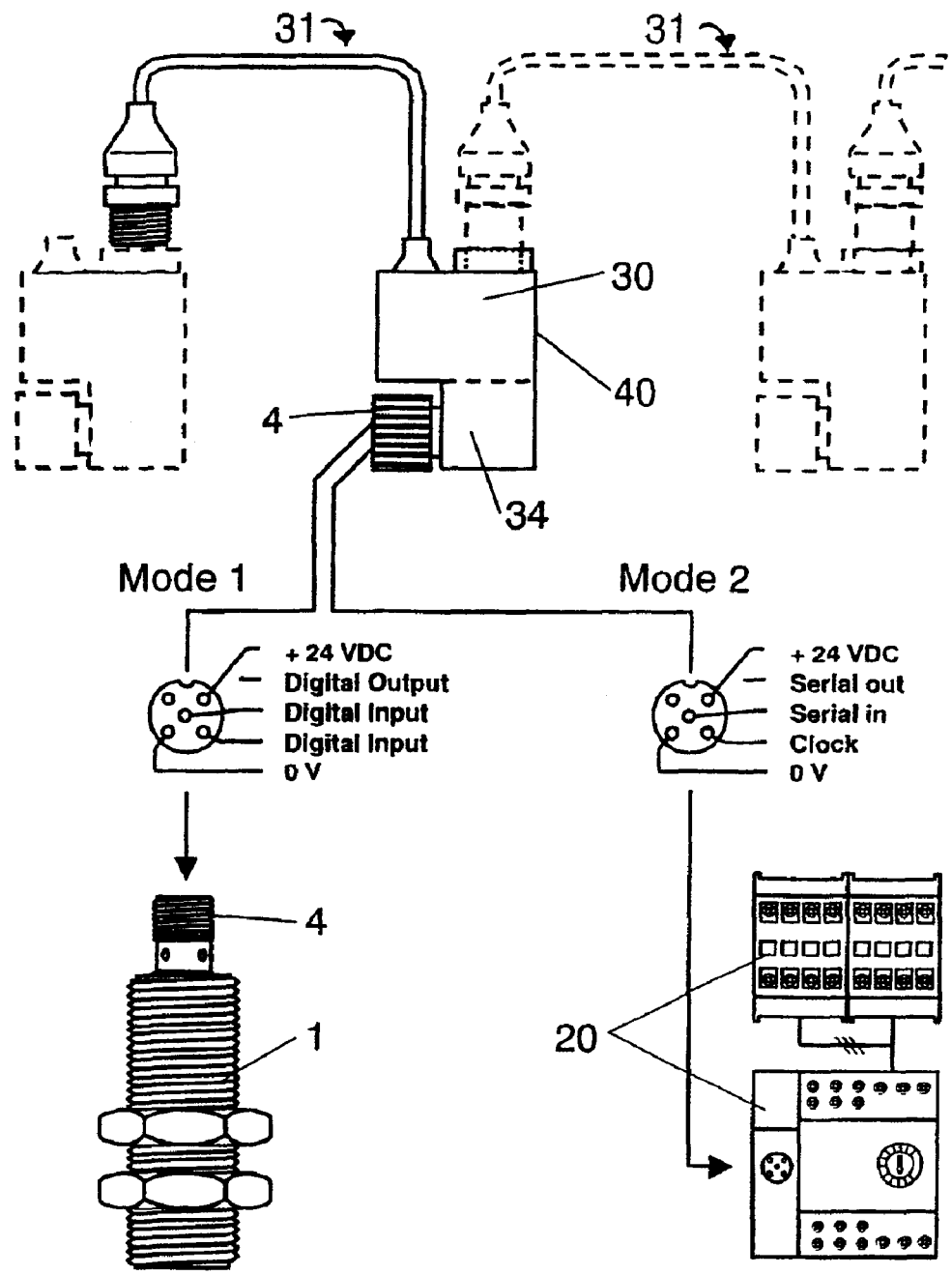
FIG. 2 shows an embodiment of the configuration of FIG. 1.

FIG. 2 shows an example configuration, in which a fieldbus plug-in apparatus 40 is used. The fieldbus plug-in apparatus 40 contains electronic devices for providing a fieldbus interface circuit 30, to which two fieldbus cables of a fieldbus 31 can be connected, and for providing a fieldbus independent interface device 34. The fieldbus plug-in apparatus 40 also has a five-pole standard plug-in apparatus 4, to which a sensor 1 or 10, or an actuator 2 or 20, can optionally be connected.

The interface device 34 is set up to operate optionally in two operating modes; namely, in a first operating mode that is referred to as Mode 1 and in a second operating mode that is referred to as Mode 2. In Mode 1, two digital signals can be read and one digital signal can be output in a parallel mode. In Mode 2, signals can be input and output in a serial mode. The interface device 34 is also set up to select the appropriate operating mode autonomously, once an actuator or a sensor has been connected. To autonomously select the mode, once the interface device 34 has been switched on, the interface device 34 first sends a serial test message in Mode 2 to the connected appliance 1, 2, 10, or 20, and waits for a response message. If no such response arrives, the interface device 34 changes to Mode 1. The illustration in FIG. 2 shows that, for example, a simple sensor 1 causes Mode 1 to be selected, and a complex actuator 20 causes Mode 2 to be selected. The respectively appropriate signals are, therefore, applied to the plug connections, these being defined in Standards. In principle, it is possible to set up the interface device to distinguish between more than two operating modes, depending on the response to the transmitted test message.

A major advantage provided by the invention is that the standard plug connection 4 that is provided on the fieldbus plug-in apparatus 40, in conjunction with the automated selection of Mode 1, allows direct connection, for example, of inductive proximity switches in a plug-in configuration as sensors, whose connection sequence and connector wiring are standardized. Simple switching devices or switchgear combinations likewise use Mode 1. Mode 2 is used for actuators and sensors having a wider range of signals in which, in addition to simple binary signals, digitized analogue values or parameters can also be transmitted.

I claim:

1. A modular connecting system for connecting an external device to a fieldbus system, comprising:
    a fieldbus-specific fieldbus interface circuit;
    a fieldbus-independent interface device connected to said interface circuit;
    said interface device having operating modes and to be selectively connected to an external device including at least one:
        sensor having a varying degree of complexity; and
        actuator having a varying degree of complexity;
    said interface device connecting the external device to said interface circuit during parallel signal transmission and serial signal transmission; and
    said interface device programmed to autonomously check a type of the external device connected to said interface device and to select an appropriate subset of said operating modes for the type of the external device.

2. The connecting system according to claim 1, wherein:
    said operating modes include a first operating mode and a second operating mode; and
    said interface device has an electronic circuit programmed to set up said interface device by selecting one of said first operating mode and said second operating mode.

3. The connecting system according to claim 2, wherein said electronic circuit is a microcontroller.

4. The connecting system according to claim 2, wherein:
    said operating modes include:
        a first operating mode for parallel signal input; and
        a second operating mode for serial signal input;
    said interface device receives an operating voltage;
    said interface device is programmed:

to operate in said second operating mode when the operating voltage is switched on;

to send a serial test message to the external device connected to said interface device and to wait for a response from the external device; and to switch to said first operating mode if the response is not received by said interface device.

5. The connecting system according to claim 1, including a fieldbus plug-in apparatus, said interface device being integrated in said fieldbus plug-in apparatus.

6. The connecting system according to claim 1, wherein said interface device is programmed to output a serial output signal in all of said operating modes.

7. The connecting system according to claim 1, wherein said interface device directly connects to the external device by a standard plug-in apparatus having a standardized connector wiring.

8. The connecting system according to claim 1, including a standard plug-in apparatus having a standardized connector wiring, said interface device directly connecting to the external device by said standard plug-in apparatus.

9. A modular connecting system for connecting an external device to at least one fieldbus cable of a fieldbus system, the connecting system comprising:

a fieldbus plug to be removably connected to the at least one fieldbus cable;

said fieldbus plug having:
  a fieldbus-specific fieldbus interface circuit to be connected to at least one fieldbus cable; and
  a fieldbus-independent interface device connected to said interface circuit;

said interface device having operating modes and to be selectively connected to an external device;

said interface device connecting the external device to said interface circuit during parallel signal transmission and serial signal transmission; and said interface device programmed to autonomously check a type of the external device connected to said interface device and to select an appropriate subset of said operating modes for the type of the external device.

10. In a fieldbus system having at least one fieldbus-specific fieldbus interface circuit, a modular connecting system for connecting an external device to the fieldbus system, the connecting system comprising:

a fieldbus-independent interface device connected to the interface circuit;

said interface device having operating modes and to be selectively connected to the external device;

said interface device connecting the external device to the interface circuit during parallel signal transmission and serial signal transmission; and said interface device programmed to autonomously check a type of the external device connected to said interface device and to select an appropriate subset of said operating modes for the type of the external device.

11. A modular connecting system for a fieldbus system, comprising:

a fieldbus-specific fieldbus interface circuit;

a fieldbus-independent interface device connected to said interface circuit;

sensors having types and varying degrees of complexity;

actuators having types varying degrees of complexity;

said interface device having operating modes and selectively connected to one of said sensors and said actuators;

said interface device connecting said one of said sensors and said actuators to said interface circuit during parallel signal transmission and serial signal transmission; and said interface device programmed to autonomously check a type of said one of said sensors and said actuators connected to said interface device and to select an appropriate subset of said operating modes for said type of said sensors and said actuators.

* * * * *